United States Patent
Kim et al.

(10) Patent No.: US 10,082,610 B2
(45) Date of Patent: Sep. 25, 2018

(54) NEAR-INFRARED CUT FILTER AND SOLID-STATE IMAGE PICKUP DEVICE INCLUDING SAME

(71) Applicant: LMS Co., Ltd., Gyeonggi-do (KR)

(72) Inventors: Joo Young Kim, Gyeonggi-do (KR); Youn Il Ko, Seoul (KR); Sung Jin Yoon, Gyeonggi-do (KR)

(73) Assignee: LMS CO., LTD., Pyeongtaek-si (KR)

( * ) Notice: Subject to any disclaimer, the term of this patent is extended or adjusted under 35 U.S.C. 154(b) by 0 days.

(21) Appl. No.: 14/781,955

(22) PCT Filed: Apr. 3, 2014

(86) PCT No.: PCT/KR2014/002870
§ 371 (c)(1),
(2) Date: Jan. 14, 2016

(87) PCT Pub. No.: WO2014/163405
PCT Pub. Date: Oct. 9, 2014

(65) Prior Publication Data
US 2016/0139308 A1    May 19, 2016

(30) Foreign Application Priority Data
Apr. 4, 2013  (KR) .................. 10-2013-0036853

(51) Int. Cl.
*G02B 5/20*    (2006.01)
*G02B 5/22*    (2006.01)
*H01L 27/146*  (2006.01)

(52) U.S. Cl.
CPC ........ *G02B 5/208* (2013.01); *H01L 27/14625* (2013.01); *G02B 5/22* (2013.01)

(58) Field of Classification Search
CPC .......... G02B 5/20; G02B 5/205; G02B 5/208; G02B 5/22; G02B 5/223; G02B 5/28; G02B 5/282; G02B 5/285; G02B 13/13; G02B 1/115; H01L 27/14625; F21S 10/02; G01N 21/278
USPC ....... 359/359, 356, 360, 361, 586, 588, 589, 359/885, 887, 888; 252/582, 587, 588, 252/589
See application file for complete search history.

(56) References Cited

U.S. PATENT DOCUMENTS

2014/0091419 A1*  4/2014  Hasegawa ............ G02B 13/004
                                                      257/432

FOREIGN PATENT DOCUMENTS

| JP | 2009-031720 | 2/2009 |
| JP | 2010-032867 | 2/2010 |
| JP | 2012-137646 | 7/2012 |
| WO | WO 2012/169447 A1 | 12/2012 |

OTHER PUBLICATIONS

English translation of JP 2010-32867, machine translated dated Dec. 21, 2016.*

* cited by examiner

*Primary Examiner* — Jie Lei
(74) *Attorney, Agent, or Firm* — Polsinelli PC

(57) ABSTRACT

A near-infrared cut filter of which a transmittance satisfies the conditions (A) and (B), and a solid-state image pickup device including the filter are provided.

15 Claims, 2 Drawing Sheets

[Fig.1]
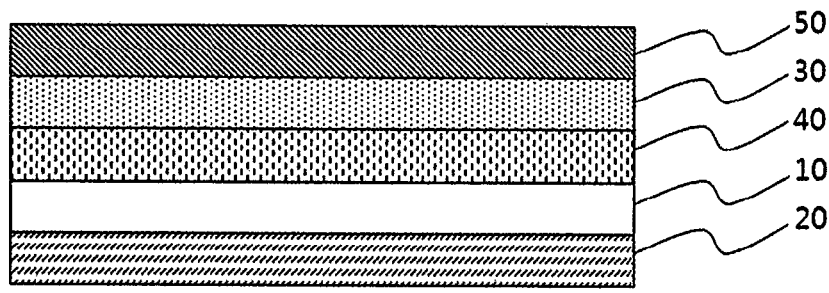
[Fig.2]
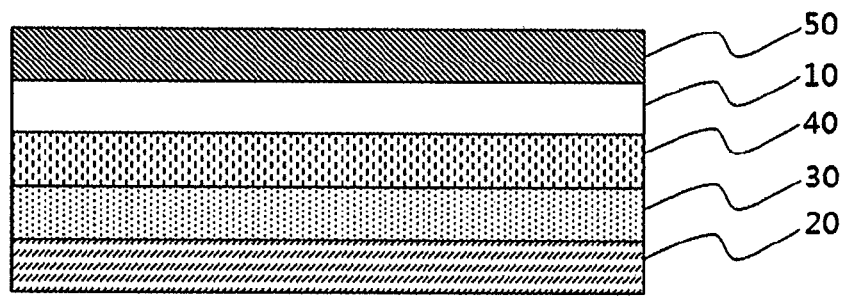
[Fig.3]
[Fig.4]
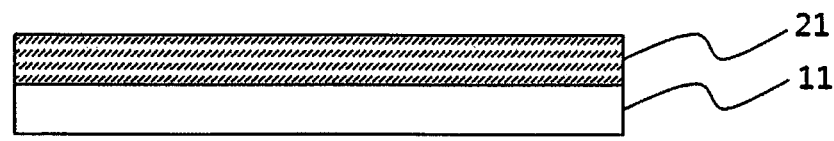

[FIG. 5]
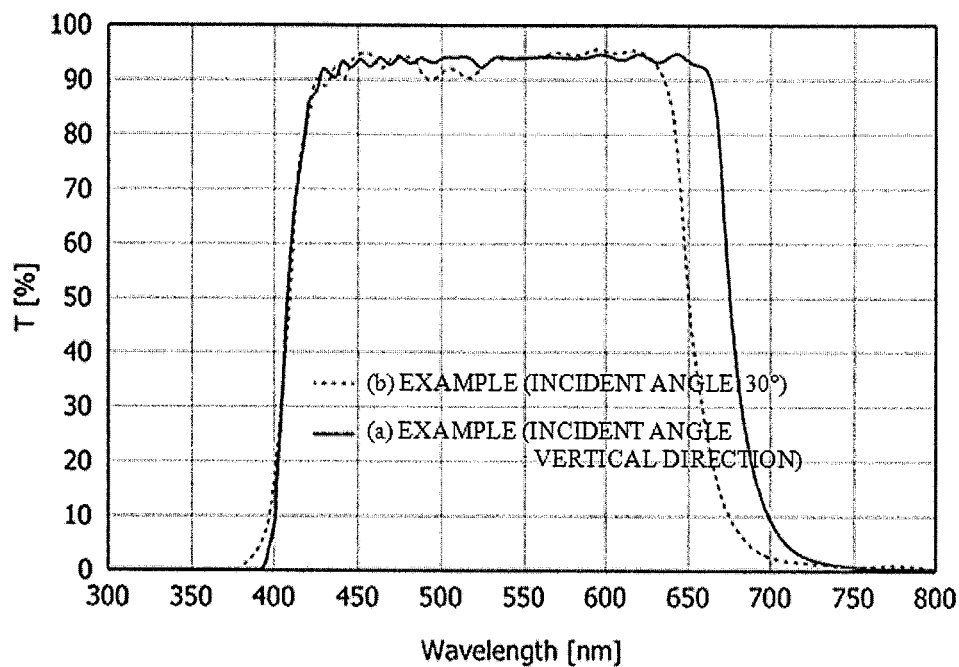
[FIG. 6]
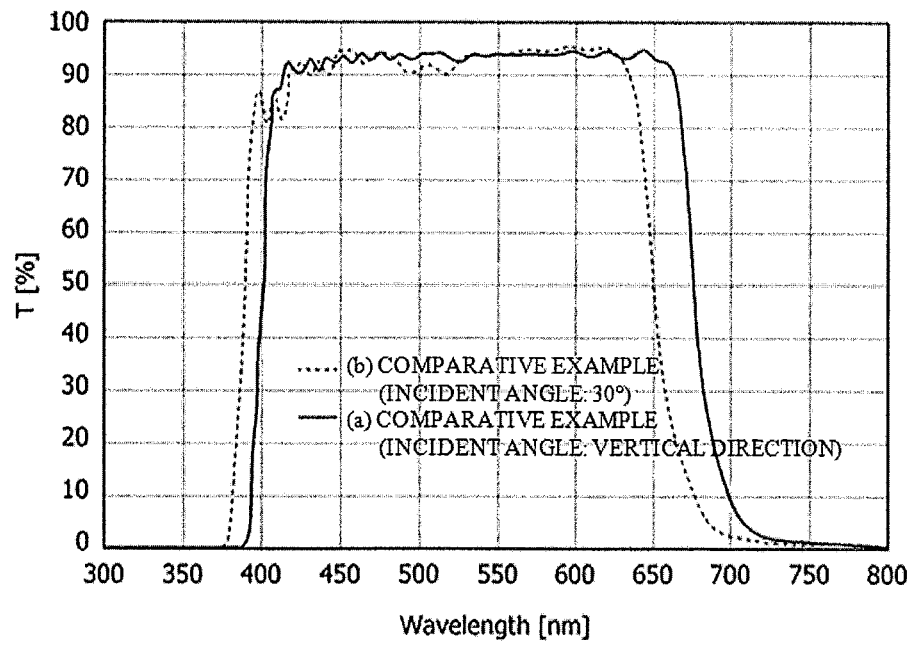

NEAR-INFRARED CUT FILTER AND SOLID-STATE IMAGE PICKUP DEVICE INCLUDING SAME

CROSS-REFERENCE TO RELATED APPLICATIONS

This application claims priority under 35 USC § 119(a) of a Korean Patent Application No. 10-2013-0036853 filed on Apr. 4, 2013, the subject matter of which is hereby incorporated by reference.

BACKGROUND

Field of the Invention

The present invention relates to a near-infrared cut filter having a new structure and a solid-state image pickup device including the same.

Background Art

A camera converts light into an electric signal using a CMOS sensor to form an image. In order to implement a high quality image in accordance with a high pixel of a camera, it is a trend to apply a newly developed back side illuminated type (BSI type) CMOS sensor to a main camera, instead of a front side illuminated type (FSI type) CMOS sensor which has been frequently used in the related art. In the FSI type CMOS sensor, a wiring line is formed above a photodiode (PD) so that light is partially blocked. In contrast, in the BSI type CMOS sensor, the wiring line is formed below the photodiode in order to receive more light, so that an image is 70% or brighter than an image formed by the FSI type CMOS sensor. Therefore, the BSI type is adopted in the most of 8 million or higher pixel cameras.

The BSI type CMOS sensor has the above-mentioned advantage because more incident light reaches the photodiode as compared with the FSI type CMOS sensor. More incident light reaches the photodiode because the BSI type CMOS sensor receives light having a relatively large incident angle due to structural improvement.

The incident angle of incident light is increased while improving a structure of the photodiode of the camera in order to receive more incident light. However, the broader incident angle of the incident light may cause a difference in a color sense.

SUMMARY OF THE INVENTION

Technical Problem

The present invention has been made in an effort to provide a near-infrared cut filter which may resolve a difference in a color sense caused by an incident angle of incident light.

The present invention has been made in an effort to further provide a solid-state image pickup device including the near-infrared cut filter.

Technical Solution

In order to achieve the object of the present invention, the near-infrared cut filter according to an exemplary embodiment of the present invention satisfies the following conditions (A) and (B): (A) an absolute value of a difference is less than or equal to 25 nm, between a shortest wavelength La at which a transmittance of light incident to the near-infrared cut filter in a vertical direction in a wavelength range greater than or equal to 380 nm is 70% and a longest wavelength Lb at which a transmittance of light incident to the near-infrared cut filter in a vertical direction in a wavelength range less than or equal to 430 nm is 30%, and (B) an absolute value of a difference is less than or equal to 10 nm, between within a wavelength range of 380 to 430 nm, a wavelength Ma at which a transmittance of light incident to the near-infrared cut filter in a vertical direction is 50% and a wavelength Mb at which a transmittance of light incident from a direction which forms an angle of 30 degrees with respect to the direction perpendicular to the near-infrared cut filter is 50%.

According to another exemplary embodiment, a solid-state image pickup device including the near-infrared cut filter is provided.

Effect of the Invention

The near-infrared cut filter may prevent a shifting phenomenon of a transmissive spectrum in accordance with the incident angle of light without retarding a transmittance in a visible light range.

BRIEF DESCRIPTION OF DRAWINGS

FIGS. 1 and 2 are cross-sectional views illustrating a laminated structure of a near-infrared cut filter according to an exemplary embodiment of the present invention.

FIG. 3 is a cross-sectional view illustrating a laminated structure of a near-infrared cut filter according to an exemplary embodiment of the present invention.

FIG. 4 is a cross-sectional view illustrating a laminated structure of a near-infrared cut filter according to Comparative Example.

FIG. 5 is a graph illustrating a light transmissive spectrum of a near-infrared cut filter according to Example.

FIG. 6 is a graph illustrating a light transmissive spectrum of a near-infrared cut filter according to Comparative Example.

DETAILED DESCRIPTION OF THE INVENTION

Hereinafter, a near-infrared cut filter according to the present invention will be described.

In one exemplary embodiment, the near-infrared cut filter according to the present invention satisfies the following conditions (A) and (B).

(A) An absolute value (|La−Lb|) of a difference between a shortest wavelength La at which a transmittance of light incident to a near-infrared cut filter in a vertical direction in a wavelength range greater than or equal to 380 nm is 70% and a longest wavelength Lb at which a transmittance of light incident to the near-infrared cut filter in a vertical direction in a wavelength range less than or equal to 430 nm is 30% is less than or equal to 25 nm, less than or equal to 20 nm, or more specifically, less than or equal to 5 nm. For example, an absolute value of a difference of La and Lb of the near-infrared cut filter may be in a range of 1 to 25 nm.

When the absolute value of the difference of La and Lb of the near-infrared cut filter is in the above-mentioned range, the transmittance sharply changes between the wavelengths La and Lb near the ultraviolet wavelength range, thereby increasing an ultraviolet ray cut efficiency. Further, a near-infrared cut filter of which an incident angle dependency of an absorbing wavelength in the ultraviolet ray region is decreased and which has an excellent viewing angle may be embodied.

(B) In a wavelength range of 380 to 430 nm, and more specifically, 400 to 430 nm, an absolute value of a difference between a wavelength Ma at which a transmittance of light incident to the near-infrared cut filter in a vertical direction is 50% and a wavelength Mb at which a transmittance of light incident from a direction which forms an angle of 30 degrees with respect to the direction perpendicular to the near-infrared cut filter is 50% may be less than or equal to 10 nm, less than or equal to 8 nm, or more specifically, less than or equal to 5 nm. For example, an absolute value of a difference of Ma and Mb of the near-infrared cut filter may be in a range of 1 to 10 nm.

When the absolute value (|Ma−Mb|) of the difference of Ma and Mb is in the wavelength range of 330 to 430 nm, even though the incident angle of light which is incident through a lens of a solid-state image pickup device varies, discoloration of an image caused thereby is prevented and color-reproduction which is almost same as that of an image which is viewed with naked eyes may be allowed.

An "incident angle" of the present invention refers to an angle of light which is incident onto a near-infrared cut filter, that is, an angle formed by a direction which is perpendicular to the near-infrared cut filter and the light which is incident onto the near-infrared cut filter. A quantity of requested incident light is increased as the number of pixels of the solid-state image pickup device is increased. Accordingly, a recent solid-state image pickup device requires to receive not only light which is incident in a vertical direction with respect to the near-infrared cut filter but also light which is incident at an angle of 30° or larger with respect to the vertical direction.

In another exemplary embodiment, the near-infrared cut filter may further satisfy conditions (C) and (D).

(C) In the wavelength range of 430 to 600 nm, an average value of the transmittance with respect to the light which is incident in a vertical direction to the near-infrared cut filter may be greater than or equal to 80%, greater than or equal to 85%, greater than or equal to 90%, or more specifically, greater than or equal to 95%. For example, in the near-infrared cut filter, in the wavelength range of 430 to 600 nm, the average value of the transmittance with respect to the light incident in a vertical direction to the near-infrared cut filter may be in a range of 80 to 95%. When the near-infrared cut filter is applied to a lens unit such as a solid-state image pickup device or a camera module, the transmittance in the visible ray range is high and the transmittance in the above wavelength range is desirably constant. When the transmittance of the near-infrared cut filter is lower than the above range in the wavelength range of 430 to 600 nm, an intensity of the light which passes through the filter is not sufficient, so that the application range may be restricted.

(D) In the wavelength range of 750 to 1150 nm, an average value of the transmittance with respect to the light which is incident in a vertical direction to the near-infrared cut filter may be less than or equal to 15%, less than or equal to 10%, or more specifically, less than or equal to 5%. For example, in the near-infrared cut filter, in the wavelength range of 750 to 1150 nm, the average value of the transmittance with respect to the light incident in a vertical direction to the near-infrared cut filter may be in a range of 0.1 to 15%. The near-infrared cut filter adopts a near-infrared cut layer having excellent near-infrared reflection performance, to efficiently block light in the range of 750 to 1150 nm.

For example, the near-infrared cut filter may have a structure including a substrate, an ultraviolet ray absorbing layer, and a near-infrared cut layer. In the near-infrared cut filter, the ultraviolet ray absorbing layer and the near-infrared cut layer may be laminated in the same direction or formed in both directions with respect to the substrate. For example, in the near-infrared cut filter, the ultraviolet ray absorbing layer may be formed on one surface of the substrate and the near-infrared cut layer may be formed on a surface opposite to the surface of the substrate on which the ultraviolet ray absorbing layer is formed.

Hereinafter, individual layers will be described in detail.

The substrate may be a glass substrate or a transparent resin substrate.

The glass substrate may use a transparent glass and if necessary, may use phosphate based glass containing CuO. When glass is used as the substrate, thermal deformation is prevented when manufacturing the filter and bending is suppressed without retarding the transmittance of the visible ray.

The transparent resin substrate desirably has an excellent strength and for example, a light transmissive resin in which inorganic filler is dispersed may be used therefor. A kind of light transmissive resin is not specifically limited, for example, may use one or more of a cyclic olefin resin, a polyarylate resin, a polysulfone resin, a polyether sulfone resin, a polyparaphenylene resin, a polyarylene ether phosphine oxide resin, a polyimide resin, a polyetherimid resin, a polyamideimide resin, an acrylic resin, a polycarbonate resin, a polyethylene naphthalate resin, and various organic or inorganic hybrid resins.

The ultraviolet ray absorbing layer may have the absorption maximum in the wavelength range of 380 to 430 nm. An ultraviolet ray absorbent which has the absorption maximum in the wavelength range of 380 to 430 nm is used for the ultraviolet ray absorbing layer, so that light in the ultraviolet region may be efficiently cut.

For example, the ultraviolet ray absorbing layer may have a structure in which the ultraviolet ray absorbent is dispersed in the resin. When the ultraviolet ray absorbent has the absorption maximum in the range of 380 to 430 nm, the ultraviolet ray absorbent is not specifically limited. Examples of the ultraviolet ray absorbent may include ABS 407 of Exciton, Inc.; UV381A, UV381B, UV382A, UV386A, VIS404A of QCR solutions Corporation; ADA1225, ADA3209, ADA3216, ADA3217, ADA3218, ADA3230, ADA5205, ADA3217, ADA2055, ADA6798, ADA3102, ADA3204, ADA3210, ADA2041, ADA3201, ADA3202, ADA3215, ADA3219, ADA3225, ADA3232, ADA4160, ADA5278, ADA5762, ADA6826, ADA7226, ADA4634, ADA3213, ADA3227, ADA5922, ADA5950, ADA6752, ADA7130, ADA8212, ADA2984, ADA2999, ADA3220, ADA3228, ADA3235, ADA3240, ADA3211, ADA3221, ADA5220, ADA7158 of HW Sands corporation; and DLS 381B, DLS 381C, DLS 382A, DLS 386A, DLS 404A, DLS 405A, DLS 405C, DLS 403A of Crystalyn chemical company.

The kind of resin which is used for the ultraviolet ray absorbing layer is not specifically limited and the light transmissive resins which are mentioned to be applied to the transparent resin substrate may be used therefor. Therefore, when the substrate is formed of the light transmissive resin, a coefficient of linear expansion thereof is similar to that of the ultraviolet ray absorbing layer, so that separation between the substrate and the ultraviolet ray absorbing layer may be reduced as compared with a case when the substrate is formed of a transparent glass. As a resin product which is used for the ultraviolet ray absorbing layer, cyclic olefin resin may include ARTON of JSR corporation, ZEONEX of ZEON corporation, and Topas of TOPAS Advanced Polymers, Inc. and a polycarbonate resin may include APEL of MITSUI Chemicals, a polyamideimide resin may include Acrypet of Mitsubishi Rayon Co., Ltd., SOXR of NKK corporation, and VYLOMAX of TOYOBO Co., Ltd.

For example, UV386A (product by QCR solutions corporation), Topas 6045-04 (product by TOPAS Advanced Polymers, Inc.), and a toluene solvent (product by Sigma Aldrich Corporation) are mixed to manufacture an ultraviolet ray absorbing solution and the manufactured ultraviolet ray absorbing solution is used to form the ultraviolet ray absorbing layer.

The near-infrared cut layer serves to reflect light in a near-infrared region. The near-infrared cut layer includes an aluminum deposition layer, a precious metal thin film, and indium oxide as main components and may use a resin layer formed by dispersing metal oxide fine particles to which tin oxide is added and a dielectric multilayer in which high refractive index layers and low refractive index layers are alternately laminated.

For example, in the near-infrared cut layer, a dielectric layer having a first refractive index and a dielectric layer having a second refractive index may be alternately laminated. A difference of refractive indexes of the dielectric layer having a first refractive index and the dielectric layer having a second refractive index may be greater than or equal to 0.2, greater than or equal to 0.3 or in a range of 0.2 to 1.0.

For example, the dielectric layer having a first refractive index may be a layer which has a relatively high refractive index and the dielectric layer having a second refractive index may be a layer which has a relatively row refractive index. In this case, the refractive index of the dielectric layer having the first refractive index may be in a range of 1.6 to 2.4 and the refractive index of the dielectric layer having the second refractive index may be in a range of 1.3 to 1.6.

The dielectric layer having the first refractive index may be formed of one or more selected from a group consisting of titanium oxide, alumina, zirconium oxide, tantalum pentoxide, niobium pentoxide, lanthanum oxide, yttrium oxide, zinc oxide, zinc sulfide, and indium oxide. Indium oxide may further include a small amount of titan oxide, tin oxide, and cerium oxide, if necessary.

The dielectric layer having the second refractive index may be formed of one or more selected from a group consisting of silica, lanthanum fluoride, magnesium fluoride, and aluminasodium fluoride.

A method of forming a near-infrared cut layer is not specifically limited, for example, may be performed by a CVD method, a sputtering method, or a vacuum deposition method.

In the near-infrared cut layer, dielectric layers having a first refractive index and dielectric layers having a second refractive index may be alternately laminated to form 5 to 61 layers, 11 to 51 layers, or 21 to 31 layers. The near-infrared cut layer may be designed by considering a desired range of reflection or refractive index, or a wavelength range to be cut.

The near-infrared cut filter may further include a near-infrared ray absorbing layer containing a near-infrared ray absorbent. The near-infrared ray absorbing layer may have a structure in which a near-infrared ray absorbent is dispersed in the resin. Most of the light in the near-infrared region is reflected by the near-infrared cut layer. However, when the incident angle of the light is increased, the transmissive spectrum of the near-infrared cut layer may vary in a case when the light is vertically (incident angle) 0° incident onto the near-infrared cut filter and a case when the incident angle is large and thus the color of the image may be distorted. These problems may be solved by forming the near-infrared ray absorbing layer. Further, in the near-infrared cut filter, the near-infrared cut layer and the near-infrared ray absorbing layer are simultaneously formed to prevent the filter from being deteriorated. Specifically, when only the near-infrared ray absorbing layer is formed, the filter may deteriorate due to optical energy which is absorbed by the near-infrared ray absorbing layer. In the present invention, the near-infrared cut layer and the near-infrared ray absorbing layer are simultaneously formed, thereby preventing the filter from deteriorating.

A kind of resin which forms the near-infrared ray absorbing layer is not specifically limited, for example, may use one or more of a cyclic olefin resin, a polyarylate resin, a polysulfone resin, a polyether sulfone resin, a polyparaphenylene resin, a polyarylene ether phosphine oxide resin, a polyimide resin, a polyetherimide resin, a polyamideimide resin, an acrylic resin, a polycarbonate resin, polyethylene naphthalate resin, and various organic or inorganic hybrid resins.

The near-infrared ray absorbing layer may include a near-infrared ray absorbent which satisfies conditions (E) and (F).

(E) The absorption maximum is generated in the wavelength range of 600 to 800 nm and the transmittance in the wavelength range of 430 to 600 nm is 80% or larger.

(F) An absolute value of a difference between the longest wavelength Na at which the transmittance in the wavelength range which is greater than or equal to the absorption maximum is 70% and the shortest wavelength Nb at which the transmittance in the wavelength range which is greater than or equal to 600 nm is 30% is less than or equal to 75 nm.

As the near-infrared ray absorbent, one or more of various types of dye, pigment, and metal complex compound may be used, but the near-infrared ray absorbent is not specifically limited. For example, as the near-infrared ray absorbent, a cyanine based compound, a phthalo cyanine based compound, a naphthalocyanine based compound, or a dithiol metal complex compound may be used.

One of them is solely used for the near-infrared ray absorbent or in some cases, two or more of them are mixed to be used or the near-infrared ray absorbent may be formed to be divided into two layers.

A content of the near-infrared ray absorbent may be, for example, in the range of 0.001 to 10 part by weight, 0.01 to 10 part by weight, or 0.5 to 5 part by weight with respect to 100 part by weight of resin. The content of the near-infrared ray absorbent is adjusted within the above range, so that the shift phenomenon of the transmissive spectrum in accordance with the incident angle is corrected and excellent near-infrared ray cutting effect may be achieved.

Hereinafter, the present invention will be described in more detail with reference to the description of drawings. The following description of the drawings is only for describing the present invention in detail, but does not limit the scope of the invention.

FIG. 1 is a cross-sectional view illustrating a laminated structure of a near-infrared cut filter according to an exemplary embodiment of the present invention.

Referring to FIG. 1, a near-infrared cut layer 20 which is formed of a dielectric multilayer is formed below a glass substrate 10. The near-infrared cut layer 20 serves to reflect the light in the near-infrared ray region to block the light.

A near-infrared ray absorbing layer 40 is formed above the glass substrate 10. The near-infrared ray absorbing layer 40 includes a near-infrared ray absorbent which is dispersed in a resin and the near-infrared ray absorbent has the absorption maximum in the wavelength range of 600 to 800 nm and a transmittance thereof in the wavelength range of 430 to 600 nm is greater than or equal to 80%. Further, an absolute value of a difference between the longest wavelength Na at which the transmittance in the wavelength range which is greater than or equal to the absorption maximum is 70% and the shortest wavelength Nb at which the transmittance in the wavelength range which is greater than or equal to 600 nm is 30% is less than or equal to 75 nm.

An ultraviolet ray absorbing layer 30 may be formed on the near-infrared ray absorbing layer 40. In the ultraviolet ray absorbing layer 30, an absolute value of a difference between a shortest wavelength La at which a transmittance of light incident to a near-infrared cut filter in a vertical direction in a wavelength range greater than or equal to 380 nm is 70% and a longest wavelength Lb at which a transmittance of light incident to the near-infrared cut filter in a vertical direction in a wavelength range less than or equal to 430 nm is 30% is less than or equal to 25 nm and in a wavelength range of 380 to 430 nm, an absolute value of a difference between a wavelength Ma at which a transmittance of light incident to the near-infrared cut filter in a vertical direction is 50% and a wavelength Mb at which a transmittance of light incident from a direction which forms an angle of 30 degrees with respect to the direction perpendicular to the near-infrared cut filter is 50% is less than or equal to 15 nm.

Further, an anti-reflection layer 50 may be formed on the ultraviolet ray absorbing layer 30. The anti-reflection layer 50 serves to reduce a phenomenon where the light which is incident onto the near-infrared ray cut filter is reflected on an interface and thus a quantity of incident light onto the near-infrared cut filter is increased. The anti-reflection layer 50 is formed to increase efficiency by reducing surface reflection and remove interference or scattering due to the reflected light. For example, the anti-reflection layer 50 may be formed by forming a dielectric substance having a refractive index which is smaller than that of glass on a surface thereof to be thin using a method such as a vacuum deposition method. The anti-reflection layer 50 may be formed using various materials which may be commercially acquired without any specific limitations.

Even though it is described that the near-infrared ray absorbing layer 40 is formed on the glass substrate 10 and the ultraviolet ray absorbing layer 30 is formed on the near-infrared ray absorbing layer 40, the laminating order is not limited thereto. For example, the near-infrared ray absorbing layer 40 may be formed on the ultraviolet ray absorbing layer 30 after forming the ultraviolet ray absorbing layer 30 on the glass substrate 10 or the anti-reflection layer 50 may be formed on the near-infrared ray absorbing layer 40. In the meantime, the near-infrared ray absorbent may be added to the ultraviolet ray absorbing layer 30 without separately forming the near-infrared ray absorbing layer 40.

As illustrated in FIG. 2, the ultraviolet ray absorbing layer 30 and the near-infrared ray absorbing layer 40 may be formed between the glass substrate 10 and the near-infrared cut layer 20. The order of laminating the ultraviolet ray absorbing layer 30 and the near-infrared ray absorbing layer 40 between the glass substrate 10 and the near-infrared cut layer 20 may be appropriately selected as described above. Also in this case, without separately forming the near-infrared ray absorbing layer 40, the near-infrared ray absorbent is added to the ultraviolet ray absorbing layer 30, so that the ultraviolet ray and the near-infrared ray may be absorbed onto one layer.

The present invention further provides a solid-state image pickup device including the near-infrared cut filter described above. The near-infrared cut filter according to the present invention may also be applied to a display device such as a PDP. However, in recent years, the near-infrared cut filter may be more desirably applied to a solid-state image pickup device which requires a high pixel, for example, a 8 million or higher pixel camera. For example, the near-infrared cut filter according to the present invention may be effectively applied to a camera for a mobile device.

Examples

Hereinafter, a near-infrared cut filter with a new structure according to the present invention will be described in more detail using specific Examples of the present invention. The Examples which will be described below are only for describing the present invention in detail, but does not limit the scope of the invention.

Example

Borosilicate glass (Schott D 263 T of Schott Glass Ltd.) was cleansed using nano-strip (Cyantek Corporation) to prepare a glass substrate.

A high refractive index dielectric layer ($Ti_3O_5$) and a low refractive index dielectric layer ($SiO_2$) were alternately deposited on one surface of the glass substrate using an E-beam evaporator to form a near-infrared cut layer. An ultrasonic cleaner was used to cleanse and remove a foreign substance generated during the deposition process.

Separately from this, UV386A (product of QCR Solution Corporation) which is an ultraviolet ray absorbing dye, Topas 6015-04 (product of TOPAS Advanced Polymers, COP) which is a resin material, and toluene (product of Sigma Aldrich Corporation) were mixed and agitated using a magnetic stirrer for one day or longer to manufacture an ultraviolet ray absorbing solution. A content of the ultraviolet ray absorbing dye is 1.2 part by weight with respect to 100 part by weight of resin.

Thereafter, the manufactured ultraviolet ray absorbing solution was spin-coated on a surface opposite to a surface of the glass substrate on which the near-infrared cut layer was formed. Specifically, the ultraviolet ray absorbing solution was coated on the glass substrate using a spin coater while rotating the glass substrate at a speed of 1000 rpm or faster to form an ultraviolet ray absorbing layer and then the ultraviolet ray absorbing layer was left for one day or longer to volatilize a residue solvent.

The near-infrared cut filter was manufactured through the above processes. The laminating structure of the manufactured near-infrared cut filter is as illustrated in FIG. 3. Referring to FIG. 3, it is understood that the near-infrared cut layer 20 is formed below the glass substrate 10 and the ultraviolet ray absorbing layer 30 is formed above the glass substrate.

Comparative Example

A near-infrared cut filter was manufactured by the same process as the Example, except that the ultraviolet ray absorbing layer is not formed. The laminating structure of the manufactured near-infrared cut filter is as illustrated in FIG. 4. Referring to FIG. 4, it is understood that the near-infrared cut layer 21 is formed above the glass substrate 11.

Experimental Example

Light transmissive spectrums of the near-infrared cut filters which are manufactured in Example and Comparative Example were measured. The light transmissive spectrum was measured for light (a) which is incident to the near-infrared cut filter in a vertical direction and light (b) which is incident in a direction which forms an angle of 30° with respect to the direction perpendicular to the near-infrared cut filter. The measuring results of the light transmissive spectrum are illustrated in FIGS. 5 and 6, respectively.

FIG. 5 is a light transmissive spectrum of the near-infrared cut filter manufactured in Example 1. Referring to FIG. 5, it is understood that in a wavelength range of 380 to 430 nm, and more specifically, 400 to 430 nm, an absolute value of a difference between a wavelength Ma at which a transmittance of light incident to the near-infrared cut filter in a vertical direction is 50% and a wavelength Mb at which a transmittance of light incident from a direction which forms an angle of 30 degrees with respect to the direction perpendicular to the near-infrared cut filter is 50% is less than or equal to 5 nm.

FIG. 6 is a light transmissive spectrum of the near-infrared cut filter manufactured in Comparative Example 1. Referring to FIG. 6, it is understood that in a wavelength range of 380 to 430 nm, and more specifically, 400 to 430 nm, an absolute value of a difference between a wavelength Mc at which a transmittance of light incident to the near-infrared cut filter in a vertical direction is 50% and a wavelength Md at which a transmittance of light incident from a direction which forms an angle of 30 degrees with respect to the direction perpendicular to the near-infrared cut filter is 50% exceeds 11 nm.

Comparing FIGS. 5 and 6, it is understood that the near-infrared cut filter according to the present invention may efficiently prevent the shift of the light in accordance with the incident angle, in the range of 380 to 430 nm.

What is claimed is:

1. A near-infrared cut filter having a laminating structure, comprising:
    a near-infrared cut layer reflecting incident light in a near-infrared region;
    a near-infrared ray absorbing layer absorbing the incident light in a near-infrared region and including a near-infrared ray absorbent dispersed in a first resin, a content of the near-infrared ray absorbent in a range of 0.001 to 10 part by weight with respect to 100 part weight of the first resin;
    an ultraviolet ray absorbing layer contacting the near-infrared ray absorbing layer, absorbing the incident light in an ultraviolet region, including an ultraviolet ray absorbent dispersed in a second resin; and
    a transparent substrate disposed between the near-infrared cut layer and the near-infrared ray absorbing layer, thereby separating the near-infrared cut layer from the near-infrared ray absorbing layer,
    wherein a transmittance of the near-infrared cut filter satisfies the following conditions (A) and (B):
    (A) in a wavelength range greater than or equal to 380 nm, an absolute value of a difference between a shortest wavelength La at which a transmittance of light incident to a near-infrared cut filter in a vertical direction is 70% and a longest wavelength Lb at which a transmittance of light incident to the near-infrared cut filter in a vertical direction in a wavelength range less than or equal to 430 nm is 30% is less than or equal to 25 nm,
    (B) in a wavelength range of 380 to 430 nm, an absolute value of a difference between a wavelength Ma at which a transmittance of light incident to the near-infrared cut filter in a vertical direction is 50% and a wavelength Mb at which a transmittance of light incident from a direction which forms an angle of 30 degrees with respect to the direction perpendicular to the near-infrared cut filter is 50% is less than or equal to 10 nm, and
    a shift of the transmittance of light incident from the direction which forms the angle of 30 degrees in the wavelength range of 380 to 430 nm is prevented.

2. The near-infrared cut filter of claim 1, wherein the near-infrared cut filter satisfies the following conditions (C) and (D):
    (C) in the wavelength range of 430 to 600, an average value of the transmittance of light which is incident onto the near-infrared cut filter in a vertical direction is greater than or equal to 80%; and
    (D) in the wavelength range of 750 to 1150, an average value of the transmittance of light which is incident onto the near-infrared cut filter in a vertical direction is less than or equal to 15%.

3. The near-infrared cut filter of claim 1, further comprising an anti-reflection layer disposed over the transparent substrate and reducing reflection of incident light in an overall wavelength onto the near-infrared cut filter.

4. The near-infrared cut filter of claim 1, wherein the ultraviolet ray absorbing layer is disposed on a first surface of the transparent substrate and the near-infrared cut layer is disposed on a second surface opposite to the first surface of the transparent.

5. The near-infrared cut filter of claim 4, wherein the ultraviolet ray absorbing layer and the near-infrared ray absorbing layer are disposed on the first surface of the transparent substrate.

6. The near-infrared cut filter of claim 5, wherein the ultraviolet ray absorbing layer is disposed on the infrared ray absorbing layer.

7. The near-infrared cut filter of claim 4, wherein the ultraviolet ray absorbing layer includes an ultraviolet ray absorbent having an absorption maximum in a wavelength range of 380 to 430 nm.

8. The near-infrared cut filter of claim 4, wherein the ultraviolet ray absorbing layer includes a near-infrared ray absorbent having an absorption maximum in a wavelength range of 600 to 800 nm.

9. The near-infrared cut filter of claim 1, the content of the near-infrared ray absorbent is in a range of 0.01 to 10 part or 0.5 to 5 part by weight with respect to 100 part weight of the resin.

10. The near-infrared cut filter of claim 1, wherein the transparent substrate is a glass substrate.

11. The near-infrared cut filter of claim 1, wherein the transparent substrate is a transparent resin substrate.

12. The near-infrared cut filter of claim 1, wherein the near-infrared cut layer has an alternately laminated structure with first and second dielectric layers having first and second refractive indexes, respectively, wherein a difference between the first refractive index and the second refractive index is greater than or equal to 0.2.

13. The near-infrared cut filter of claim 12, wherein in the near-infrared cut layer, dielectric layers having a first refractive index and dielectric layers having a second refractive index the first and second dielectric layers are alternately laminated to form have 5 to 61 layers.

14. The near-infrared cut filter of claim 1, wherein the near-infrared ray absorbing layer includes an absorbent which satisfies conditions (E) and (F):
  (E) the absorption maximum is generated in the wavelength range of 600 to 800 nm and the transmittance in the wavelength range of 430 to 600 nm is 80% or larger, and
  (F) an absolute value of a difference between a longest wavelength Na at which the transmittance in the wavelength range which is greater than or equal to an absorption maximum is 70% and a shortest wavelength Nb at which the transmittance in the wavelength range which is greater than or equal to 600 nm is 30% is less than or equal to 75 nm.

15. A solid-state image pickup device, comprising the near-infrared cut filter of claim 1.

* * * * *